(12) United States Patent
Appelt

(10) Patent No.: US 8,304,878 B2
(45) Date of Patent: Nov. 6, 2012

(54) EMBEDDED COMPONENT SUBSTRATE, SEMICONDUCTOR PACKAGE STRUCTURE USING THE SAME AND FABRICATION METHODS THEREOF

(75) Inventor: Bernd Karl Appelt, Gulf Breeze, FL (US)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 186 days.

(21) Appl. No.: 12/781,213

(22) Filed: May 17, 2010

(65) Prior Publication Data

US 2011/0278713 A1    Nov. 17, 2011

(51) Int. Cl.
*H01L 23/02* (2006.01)
*H01L 23/22* (2006.01)
*H01L 23/24* (2006.01)
*H01L 21/00* (2006.01)

(52) U.S. Cl. ........ 257/686; 257/687; 438/107; 438/108; 438/109; 438/118; 438/119

(58) Field of Classification Search .................. None
See application file for complete search history.

(56) References Cited

U.S. PATENT DOCUMENTS

| | | | | |
|---|---|---|---|---|
| 8,034,660 B2* | 10/2011 | Takahashi | ..................... | 438/108 |
| 2005/0098868 A1* | 5/2005 | Chang et al. | ................... | 257/686 |
| 2006/0175695 A1* | 8/2006 | Lee | ................ | 257/686 |
| 2006/0231939 A1* | 10/2006 | Kawabata et al. | ............ | 257/686 |
| 2008/0142940 A1* | 6/2008 | Dunne | .......... | 257/686 |
| 2008/0157327 A1* | 7/2008 | Yang | .............. | 257/686 |
| 2009/0115045 A1* | 5/2009 | Hsu et al. | ........... | 257/686 |
| 2009/0243065 A1* | 10/2009 | Sugino et al. | ................ | 257/686 |
| 2010/0059898 A1* | 3/2010 | Keeth et al. | ................... | 257/777 |
| 2010/0258927 A1* | 10/2010 | Ganesan et al. | ............. | 257/686 |
| 2011/0024899 A1* | 2/2011 | Masumoto et al. | .......... | 257/737 |

* cited by examiner

*Primary Examiner* — N Drew Richards
*Assistant Examiner* — Michael Jung
(74) *Attorney, Agent, or Firm* — J.C. Patents

(57) ABSTRACT

An embedded electronic component semiconductor package structure and a packaging process thereof are provided. By providing two or more preformed building blocks, the electronic component can be assembled to the joined building blocks to obtain the embedded component semiconductor package structure.

19 Claims, 7 Drawing Sheets

EMBEDDED COMPONENT SUBSTRATE, SEMICONDUCTOR PACKAGE STRUCTURE USING THE SAME AND FABRICATION METHODS THEREOF

BACKGROUND OF THE INVENTION

1. Field of the Invention

The present invention generally relates to a substrate, a semiconductor package structure and the fabrication methods thereof, and more particularly, to an embedded component substrate, the semiconductor package structure using the same and fabrication methods thereof.

2. Description of Related Art

Generally speaking, a circuit substrate is mainly formed through alternately stacking a plurality of patterned circuit layers and dielectric layers between the patterned circuit layers for isolating two adjacent patterned circuit layers. The adjacent patterned circuit layers can be electrically connected through plated through holes (PTH) or conductive vias penetrating the dielectric layers. In addition, various electronic components (such as active or passive components) will be arranged on the surface of the circuit substrate or embedded inside the circuit substrate, and the purpose of electrical signal propagation is achieved through the circuit design of internal circuits.

In order to satisfy the requirements of light weight and compactness on electronic products in the market, packages using the embedded component substrate have been developed. However, as the electronic components are usually standardized and have specific electric properties, while the fabrication of the embedded component substrate for accommodating the electronic components with various electric properties has to be custom-made with relatively low yield and has long cycle time.

For facilitating the further implementation of this technology, it is desirable to simplify the fabrication of the embedded component substrate, so as to increase the yield and lower the production costs.

SUMMARY OF THE INVENTION

Accordingly, the present invention provides a packaging process for an embedded component semiconductor package structure with at least one electronic component, which advances the production yield and decreases the manufacturing cost and cycle time.

The present invention also provides a semiconductor package structure having at least one embedded electronic component, and/or a substrate embedded with at least one electronic component.

An embodiment of the present invention is directed to a semiconductor package structure, including a mounting building block having at least one electronic component mounted thereon, a spacing building block and a cover building block. The spacing building block is joined with the mounting building block and the cover building block. The semiconductor package structure further comprises a plurality of conductive vias for electrically connecting the mounting building block, the spacing building block and the cover building block and an encapsulant that fills up a cavity enclosed by the mounting building block, the spacing building block and the cover building block joined together. The at least one electronic component is disposed within the cavity and is embedded within the encapsulant.

Another embodiment of the present invention is directed to a semiconductor package structure, including a mounting building block having at least a first electronic component mounted thereon and a cavity building block having at least a second electronic component. The cavity building block is joined with the mounting building block. The semiconductor package structure further comprises a plurality of conductive vias for electrically connecting the mounting building block and the cavity building block and an encapsulant that fills up a cavity enclosed by the mounting building block and the cavity building block joined together. The at least first and second electronic components are disposed within the cavity and embedded within the encapsulant.

Another embodiment of the present invention is directed to a package process of an embedded electronic component semiconductor package structure. After providing a mounting building block, at least one electronic component is mounted on the mounting building block. A spacing building block is joined with the mounting building block, so that the at least one electronic component is disposed within a cavity confined by the joined spacing and mounting building blocks. After filling the cavity with an encapsulant to encapsulate the at least one electronic component, a cover building block is joined with the spacing building block to seal the cavity.

Another embodiment of the present invention is directed to a package process of an embedded electronic component semiconductor package structure. A mounting building block is provided and at least a first electronic component is mounted on the mounting building block. A cavity building block is provided and at least a second electronic component is mounted to the cavity building block. After filling a cavity of the cavity building block with an encapsulant to encapsulate the at least second electronic component, the cavity building block is joined with the mounting building block. The at least first and second electronic components are disposed within the cavity confined by the joined cavity and mounting building blocks and are embedded within the encapsulant.

According to the embodiment of the present invention, the different building blocks can be directly bonded or joined by applying conductive adhesives there-between.

In the present invention, by providing different preformed building blocks, the packaging process for the embedded electronic component semiconductor package structure can be simplified and offer greater flexibility. In this way, the assembly cycle time and/or the production yield of the semiconductor package structure can be shortened.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
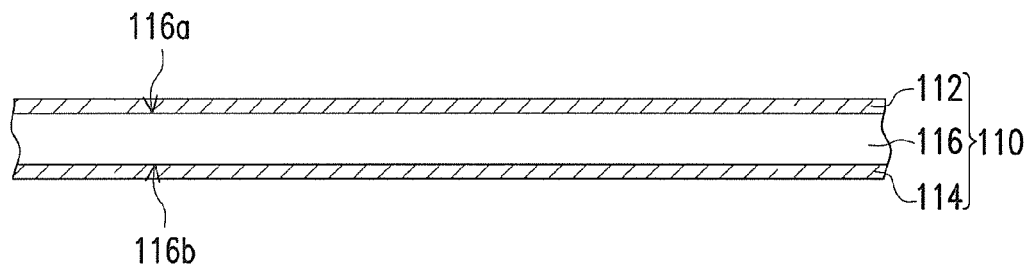
FIGS. 1A to 1D illustrate fabricating process steps of an exemplary building block for the substrate according to the embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

It should be known that although "first", "second" and the like are used in the present invention to describe each element, region, layer, and/or part, such words are not intended to restrict the element, the region, the layer, and/or the part, but shall be considered to distinguish one element, region, layer, or part from another. Therefore, under the circumstance of without departing from the teaching of the present invention, the first element, region, layer, or part can also be called the second element, region, layer, or part.

The embodiment of the present invention provides a manufacturing process of the embedded component semiconductor package structure, comprising at least providing two or more preformed building blocks (i.e. structural elements), assembling at least one electronic component (active or passive component) to at least one of the building blocks and then joining the building blocks to obtain the embedded component semiconductor package structure. In this way, the package assembly process can offer greater flexibility.

FIGS. 1A to 1D illustrate a fabricating process of an exemplary building block for the substrate according to the embodiment of the present invention. Referring to FIG. 1A, a substrate 110 is provided. The substrate 110 can be a multi-layered wiring board, a double-sided lamination structure or a copper clad laminate (CCL), for example. The substrate 110 comprises at least a top conductive layer 112, a bottom conductive layer 114, and a core layer 116. The core layer 116 may be formed by a prepreg comprising resin and glass fiber. The top conductive layer 112 and the bottom conductive layer 114 are separately disposed on the top surface 116a and the bottom surface 116b of the core layer 116. The top conductive layer 112 and the bottom conductive layer 114 may be formed by copper, aluminum, aluminum-copper alloy, or other suitable conductive materials.

Similarly, although "top" and "bottom" and the like are used in the present invention to describe certain regions, surfaces and/or layers, such words shall be considered to distinguish their relative positions, rather than to limit the present invention. Therefore, under the circumstance of without departing from the teaching of the present invention, the top surface or layer can also be called the bottom surface or layer.

Figure 1B:
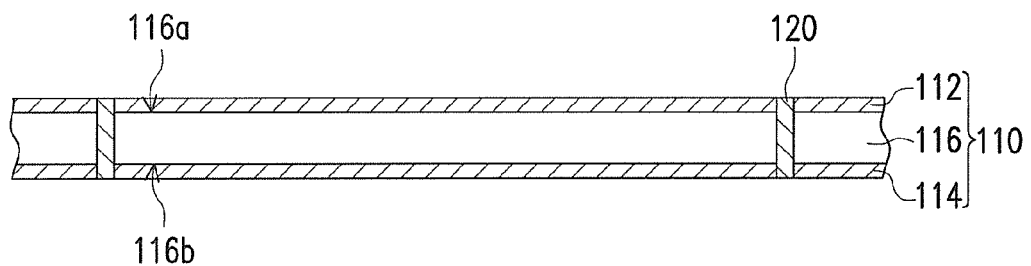

Next, referring to FIG. 1B, a plurality of conductive vias 120 is formed in the substrate 110. Each conductive via 120 connects the top conductive layer 112 and the bottom conductive layer 114. Hence, the top conductive layer 112 is electrically connected with the bottom conductive layer 114 by the conductive vias 120. The conductive vias 120 may be formed by drilling, chemical copper plating, or electroplating. The conductive vias may be filled with copper during plating or they may be lined with copper as is common for plated through holes.

Figure 1C:
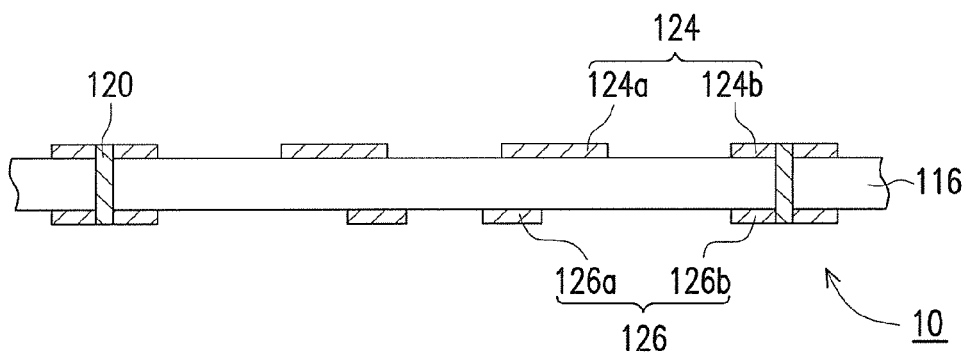

Referring to FIG. 1C, after the conductive vias 120 are formed, the top conductive layer 112 and the bottom conductive layer 114 (referring to FIG. 1B) are patterned to respectively form a patterned top conductive layer 124 and a patterned bottom conductive layer 126. The top conductive layer 112 and the bottom conductive layer 114 may be patterned by performing photolithography and etching.

The patterned top conductive layer 124 comprises a plurality of traces 124a and a plurality of first pads 124b. The patterned bottom conductive layer 126 comprises a plurality of bonding pads 126a and a plurality of second pads 126b. The first pads 124b and the second pads 126b are electrically connected by the conductive vias 120.

Figure 1D:
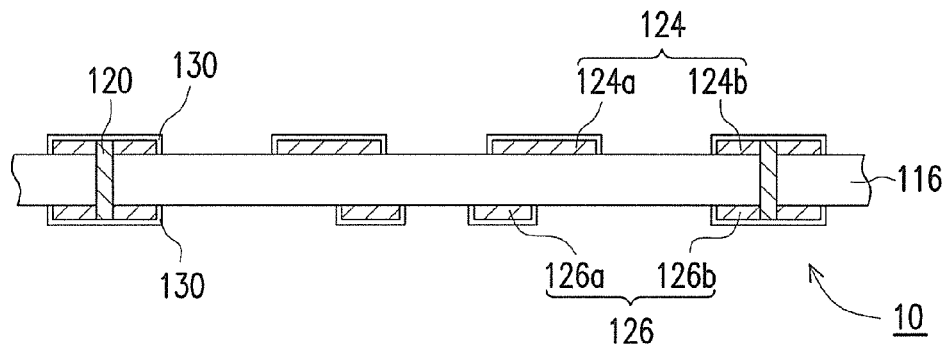

Referring to FIG. 1D, a surface treating process is performed to form a surface finish layer 130 on the surfaces of the patterned top conductive layer 124 and the patterned bottom conductive layer 126 respectively. The surface finish layer 130 can be a nickel/gold layer, a silver-containing layer or a tin-containing layer, for example. Particularly, the surface finish layer can be electroless nickel electroless palladium immersion gold (ENEPIG), electroless nickel immersion gold (ENIG), immersion silver (iAg), immersion tin (iSn), electroless plating tin (eSn) or even organic solderabilty preservatives (OSP), for example. The exemplary building block shown in FIG. 1D can be considered as a mounting building block 10, as the patterned bottom conductive layer 126 includes the bonding pads 126a suitable for being mounted with the electronic component.

Figure 2:
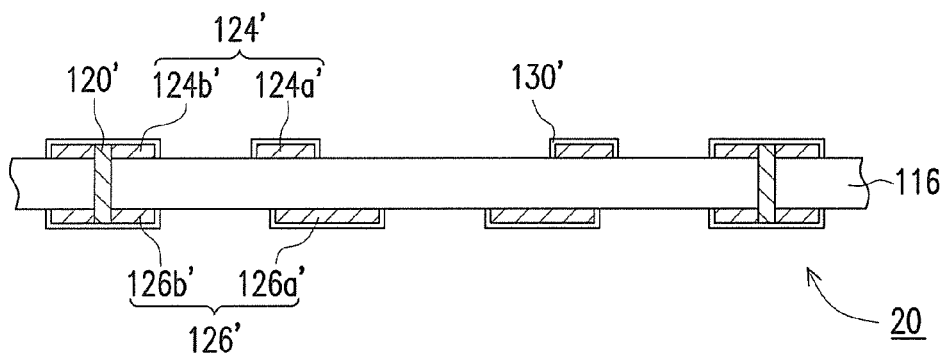
FIG. 2 illustrates another exemplary building block for the substrate according to the embodiment of the present invention.

Alternatively, as shown in FIG. 2, if the patterning process of FIG. 1C is performed with a different design for traces and pads, the patterned top conductive layer 124' comprises a plurality of first traces 124a' and a plurality of first pads 124b'. The patterned bottom conductive layer 126' comprises a plurality of second traces 126a' and a plurality of second pads 126b'. The first pads 124b' and the second pads 126b' are electrically connected by the conductive vias 120', while a surface finish layer 130' is respectively disposed on the surfaces of the patterned top conductive layer 124' and the patterned bottom conductive layer 126'. The exemplary building block shown in FIG. 2 can be considered as a cover building block 20. The difference between the mounting and the cover building blocks mainly lies in that the cover building block 20 does not necessarily have bonding pads for components and may even be designed with single-sided conductive patterns.

Figure 3:
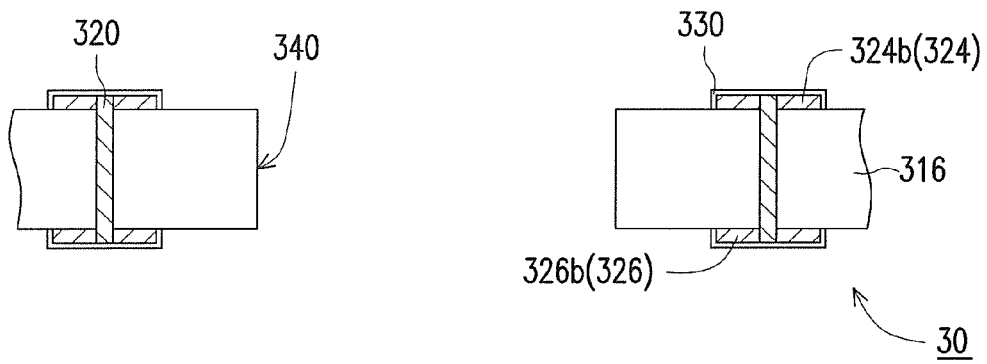
FIG. 3 illustrates another exemplary building block for the substrate according to the embodiment of the present invention.

FIG. 3 illustrates another exemplary building block for the substrate according to the embodiment of the present invention. Following the similar manufacturing process steps as described in FIGS. 1A-1D, a punching process may be performed to cut off a part of the core layer 316 to form at least one hollow space 340. The core layer 316 may include a prepreg with embedded traces, a multi-layered laminate or a CCL, for example. The patterned top conductive layer 324 comprises a plurality of first pads 324b, while the patterned bottom conductive layer 326 comprises a plurality of second pads 326b. The conductive vias 320 connect the first pads 324b and the second pads 326b, while a surface finish layer 330 is respectively disposed on the surfaces of the first pads 324b and the second pads 326b. The exemplary building block shown in FIG. 3 can be considered as a spacing building block 30 as the hollow space 340 can hold the mounted component.

The above process steps for manufacturing the exemplary building blocks are not intended to restrict the scope of the present invention, and available alternative manufacturing process steps should be included within the scope of the present invention, including build-up substrate technology with subtractive, additive, or semi-additive process, and coreless substrate technology.

Additionally, although three exemplary building blocks are described herein, it is understood by one skilled in this field that other types of building blocks with modifications in pattern designs, materials or the number of lamination layers should be included within the scope of the present invention. If the single-sided building block structure is desired, the above block structure can be further processed to remove the conductive patterns from one side.

Figure 4A:
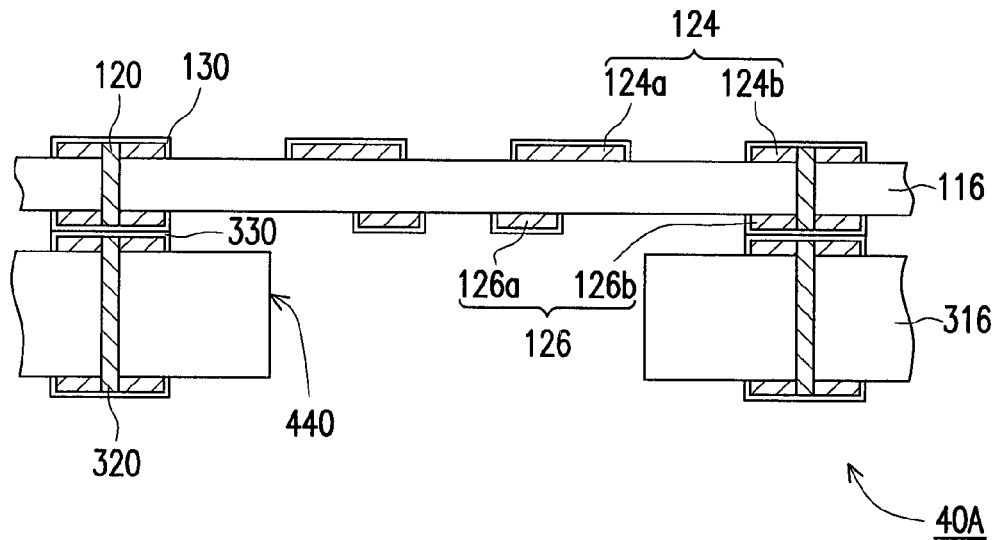
FIGS. 4A and 4B illustrate exemplary building blocks for the substrate according to the embodiments of the present invention.
Figure 4B:
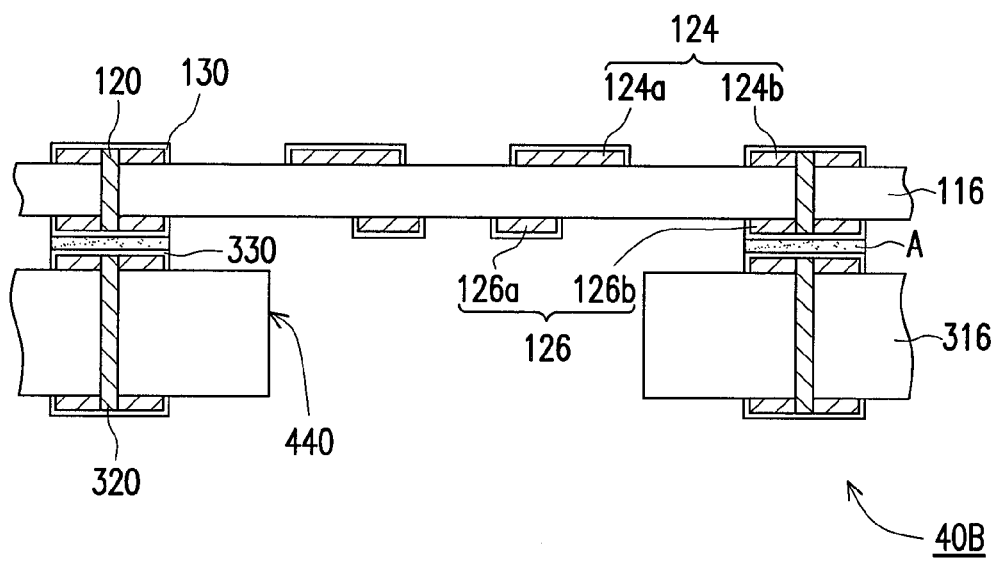

The above building blocks can also be joined together to form other building blocks. For example, as shown in FIG. 4A, the mounting building block 10 and the spacing building block 30 can be directly bonded to form a cavity building block 40A by ultrasonic bonding or thermal compression, depending on the materials of the surface finish layers of both building blocks. Depending on the metal finish option of the pads, the blocks may also be joined by reflowing. Alternatively, as shown in FIG. 4B, the mounting building block 10 and the spacing building block 30 can be bonded through a conductive adhesive A to form a cavity building block 40B. In this case, the mounting building block 10 and the spacing building block 30 are electrically connected through the conductive vias 120/320.

Figure 4C:
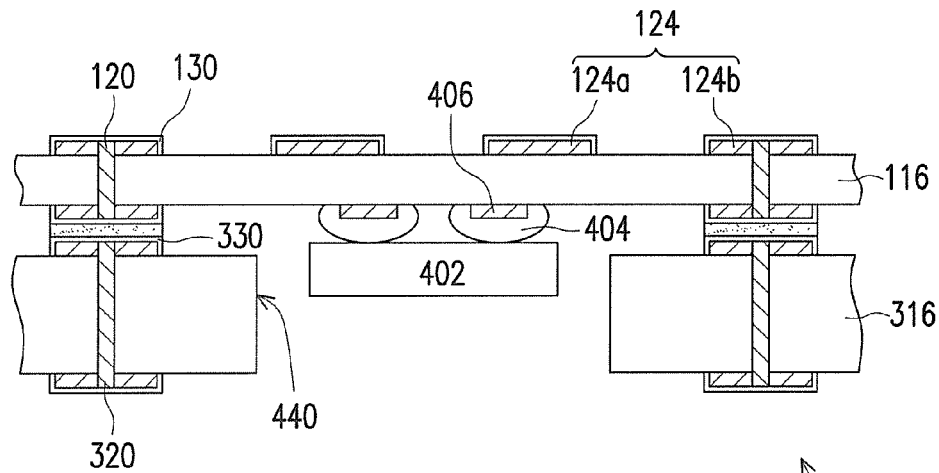
FIG. 4C illustrates a fabricating process of an exemplary embedded component substrate according to the embodiment of the present invention.

FIG. 4C illustrates a fabricating process of an exemplary embedded component substrate according to the embodiment of the present invention.

Referring to FIG. 4C, a cavity building block 40A (or 40B) is provided and an electronic component 402 is mounted to the bonding pads 406 of the building block 40A, so that the component 402 is located inside the cavity 440. In practice, the electronic component 402 may be assembled before or after joining the mounting building block 10 and the spacing building block 30. The electronic component applied in this invention may be an active component, such as a chip or a passive component, such as a capacitor or a resistor. The electronic component 402, for example, a chip, is electrically connected to the bonding pads 406 through a plurality of bumps 404 (i.e. through flip chip bonding). Alternatively, the component 402 may be electrically connected to the bonding pads 126a through wire bonding. At this stage, the structure shown in FIG. 4C can be considered as the embedded component substrate 400.

FIGS. 5A to 5D illustrate exemplary fabricating process steps of a semiconductor package structure with the embedded component according to the embodiment of the present invention.

Figure 5A:
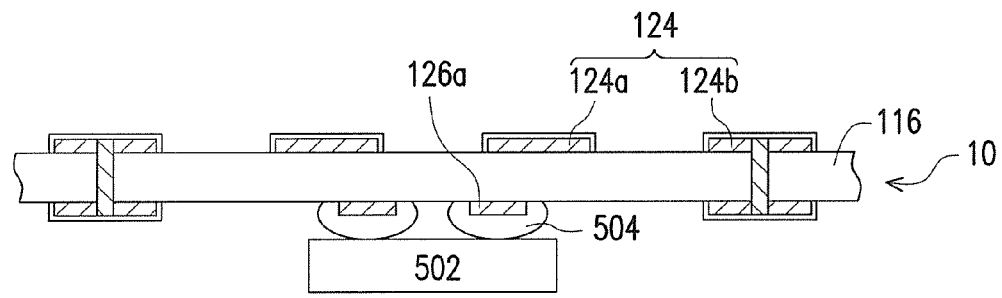
FIGS. 5A to 5D illustrate exemplary fabricating process steps of a semiconductor package structure with the embedded component according to the embodiment of the present invention.
Figure 6A:
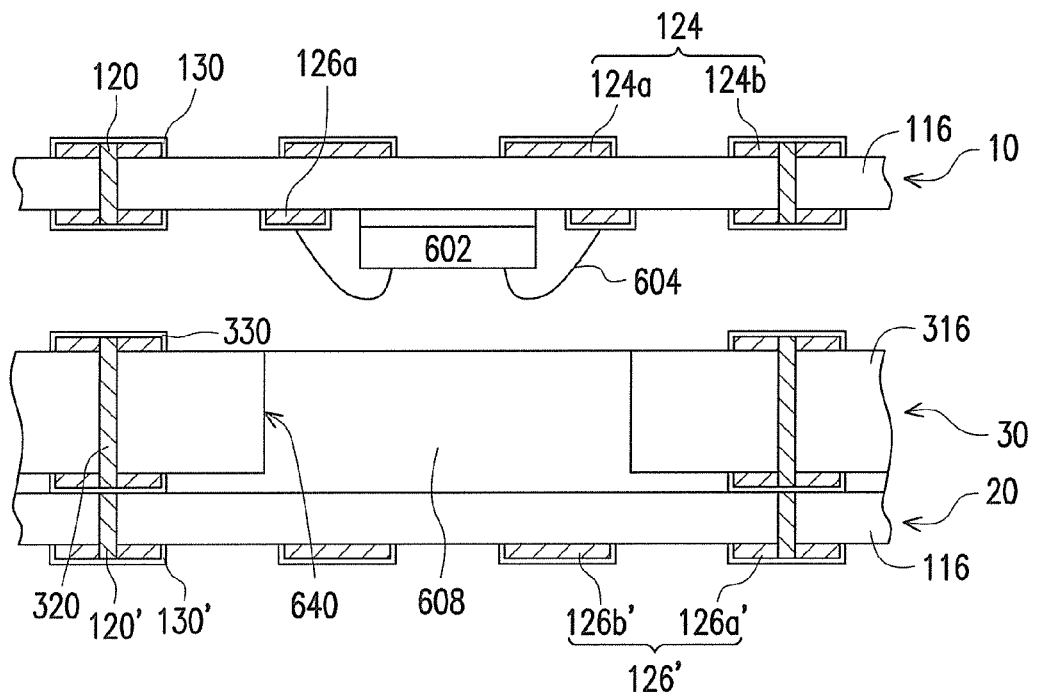
FIGS. 6A to 6B illustrate exemplary fabricating process steps of a semiconductor package structure with the embedded component according to the embodiment of the present invention.

Referring to FIG. 5A, a mounting building block 10 is provided and an electronic component 502 is mounted to the bonding pads 126a of the building block 10. The electronic component applied in this invention may be an active component, such as a chip or a passive component, such as a capacitor or a resistor. The electronic component 502, for example, a chip, is electrically connected to the bonding pads 126a through a plurality of bumps 504 (i.e. through flip chip bonding). The bumps 504 can be solder bumps, gold bumps or copper pillars, for example. Alternatively, the electronic component may be electrically connected to the bonding pads 126a through wire bonding (as shown in FIG. 6A).

Figure 5B:
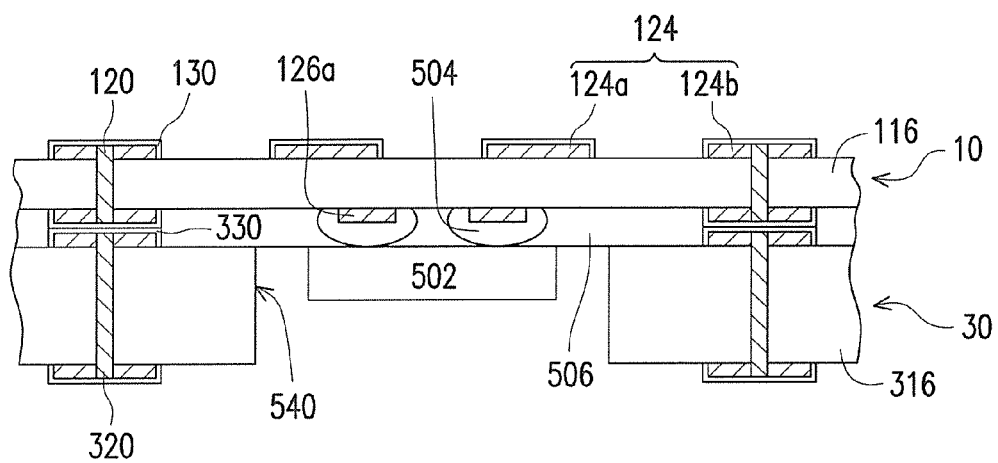

Referring to FIG. 5B, after providing a spacing building block 30, the mounting building block 10 together with the mounted component 502 is joined with the spacing building block 30. Preferably, the mounting building block 10 (together with the mounted component 502) and the spacing building block 30 are directly joined by thermal compression or ultrasonic bonding. After joining the mounting building block 10 (together with the mounted component 502) and the spacing building block 30, the mounted component 502 is located within a cavity 540 of the joined structure.

On the other hand, the mounting building block 10 (together with the mounted component 502) and the spacing building block 30 can be joined by applying a conductive adhesive (as shown in FIG. 4B).

Prior to the joining process, an underfill layer 506 may be optionally formed around the bumps 504 for increasing the package strength. However, the formation of the underfill layer 506 is optional and depends on the stability and handle ability of the component and/or the bumps.

Figure 5C:
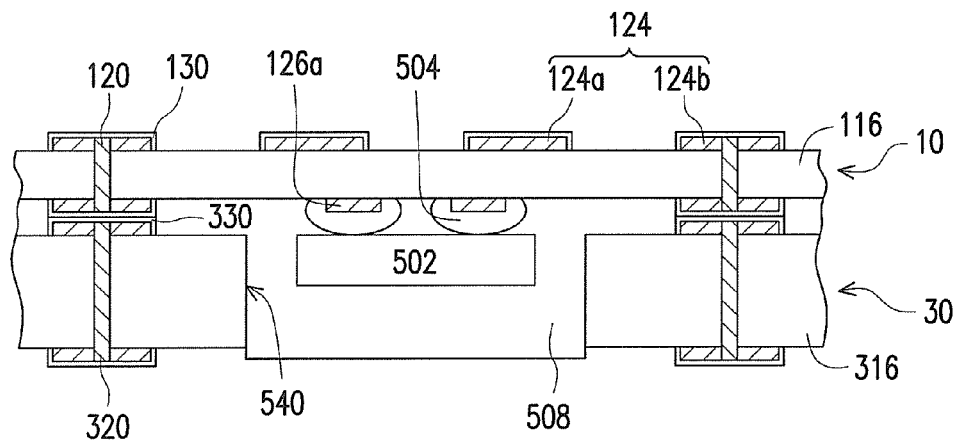

Referring to FIG. 5C, an encapsulant 508 is formed to fill up the cavity 540. That is, the encapsulant 508 may be a slightly higher than (or at least flush with) the bottom surface 30a of the spacing building block 30.

Figure 5D:
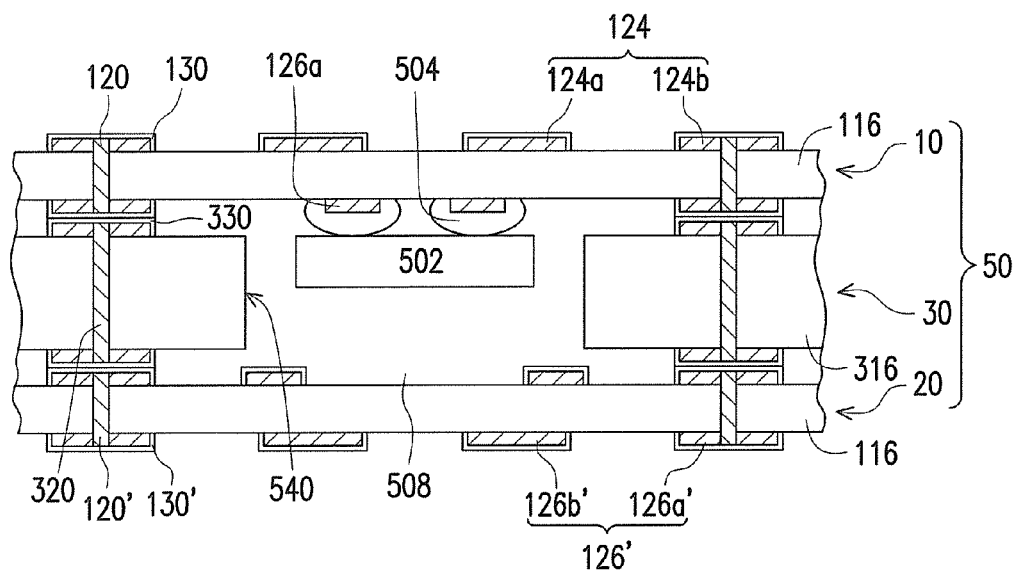

Referring to FIG. 5D, a cover building block 20 is provided and joined to the bottom surface 30a of the spacing building block 30, so as to complete the semiconductor package structure 50 with the embedded component substrate 500 (FIG. 5A). Similarly, the cover building block 20 can be joined to the joined structure of the mounting building block 10 and the spacing building block 30 by, for example, either thermal compression or ultrasonic bonding, or reflowing, or even by applying a conductive adhesive. The cover building block 20, the mounting building block 10 and the spacing building block 30 are electrically connected through the conductive vias 120/320/120'.

Alternatively, according to another embodiment, the sequence of the above described process steps can be altered. As shown in FIG. 6A, a cover building block 20 is provided and joined to the bottom surface 30a of the spacing building block 30. The cover building block 20 is shown with single-sided conductive patterns. An encapsulant 608 is then formed to fill the cavity 640 of the joined structure. Later, the mounting building block 10 together with the electronic component 602 is provided. The electronic component 602 may be a passive component, such as a resistor and electrically connected (wire bonding) to the bonding pads 126a of the building block 10 through wires 604. The wires 604 can be gold wires, copper wires or aluminum wires, for example.

Figure 6B:
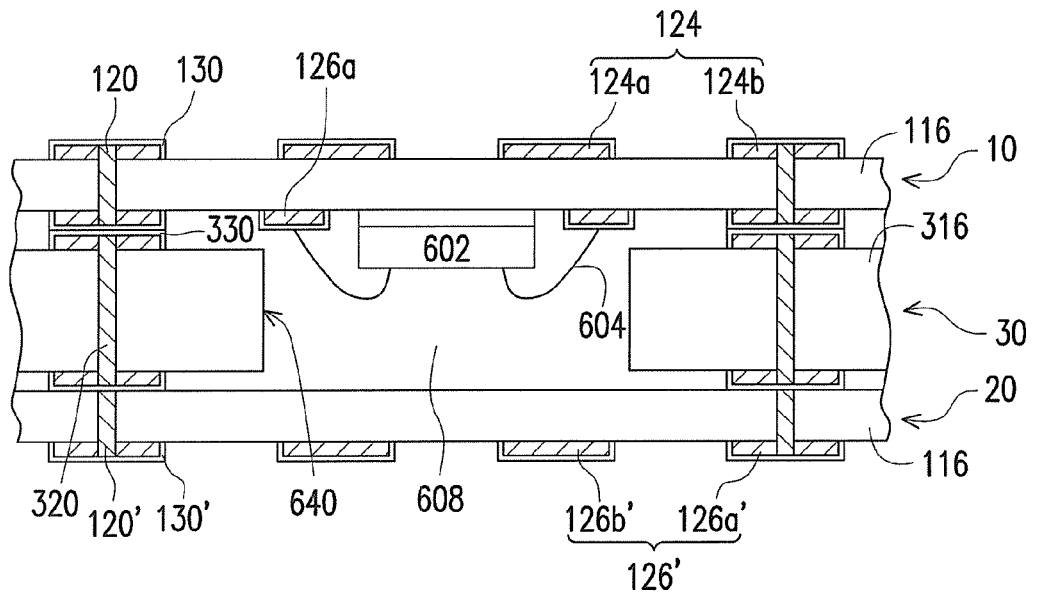

Referring to FIG. 6B, the mounting building block 10 together with the component 602 is joined with the joined structure of the spacing building block 30 and the cover building block 20. It is understood that the amount of the encapsulant 608 should be carefully calculated so that, after joining, the encapsulant 608 can fill up the cavity 640 as well as the gaps around the component 602.

Figure 7A:
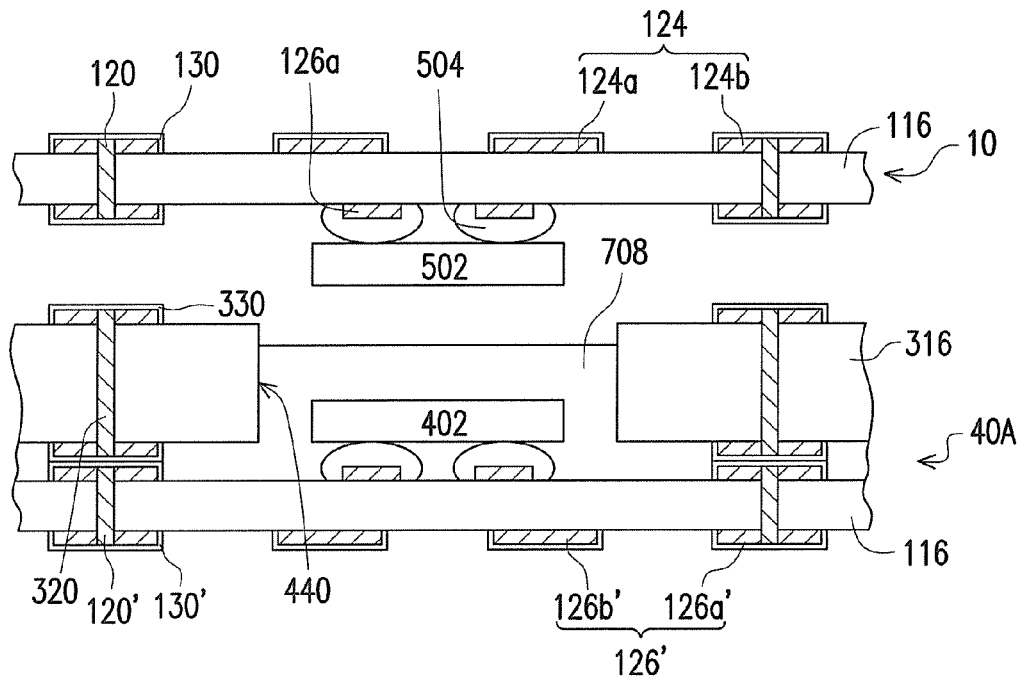
FIGS. 7A to 7B illustrate exemplary fabricating process steps of a semiconductor package structure with the embedded components according to the embodiment of the present invention.
Figure 7B:
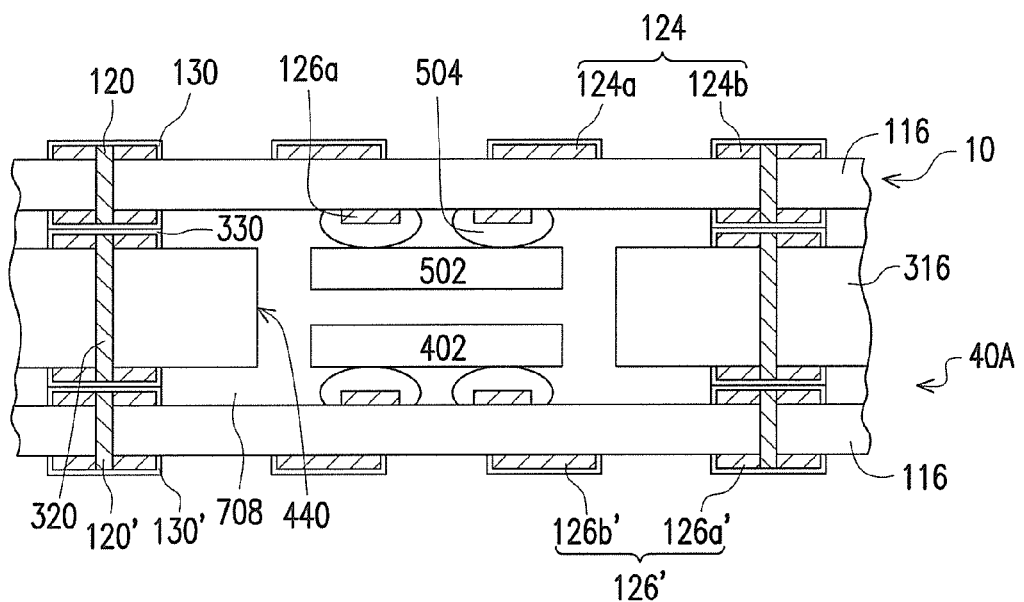

FIGS. 7A to 7B illustrate exemplary fabricating process steps of a semiconductor package structure with the embedded component according to the embodiment of the present invention.

Referring to FIG. 7A, the embedded component substrate 400 shown in FIG. 4C is provided and an encapsulant 708 is dispensed to fill the cavity 440 of the structure 400 and fills up the gaps around the component 402. As shown herein, the structure of FIG. 4C is inverted.

Referring to FIG. 7B, the mounting building block 10 together with the component 502 is joined with the embedded component substrate 400 (i.e. the cavity building block 40A embedded with component 402), so as to complete the semiconductor package structure 70 with the embedded component substrate 400. Similarly, the amount of the encapsulant 708 should be carefully calculated so that, after joining, the encapsulant 708 can fill up the cavity 440 as well as the gaps around the components 402 and 502.

According to the embodiments of the present invention, by providing preformed building blocks, the fabrication of the embedded component substrate can be simplified so that higher product yield can be achieved along with lower production costs. Moreover, electrical or functioning testing can be performed to the embedded component substrate before the subsequent assembly processes for better reliability.

Also, by employing different preformed building blocks or in combination with the embedded component substrate, stacked-chip semiconductor package structures, multiple-chip semiconductor package structures or even package-on-package structures can be obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor package structure, comprising:
  a mounting building block having at least one electronic component mounted thereon, wherein the mounting building block comprises:
  a first core layer having a first surface and a second surface opposite to the first surface;
  a first conductive layer, located on the first surface of the first core layer and comprising a plurality of first bonding pads, wherein a first surface finish layer is disposed on at least one of the first bonding pads; and
  a second conductive layer, located on the second surface of the first core layer and comprising a plurality of second bonding pads, wherein a second surface finish layer is disposed on at least one of the second bonding pads, and the at least one electronic component is electrically connected to the second conductive layer of the mounting building block;
  a spacing building block, joined with the mounting building block, wherein the spacing building block comprises:
  a second core layer having a third surface and a fourth surface opposite to the third surface;
  a third conductive layer, located on the third surface of the second core layer and comprising a plurality of third bonding pads, wherein a third surface finish layer is disposed on at least one of the third bonding pads; and
  a fourth conductive layer, located on the fourth surface of the second core layer and comprising a plurality of fourth bonding pads, wherein a fourth surface finish layer is disposed on at least one of the fourth bonding pads;
  a cover building block, joined with the spacing building block, wherein the third surface finish layer of the spacing building block is in direct physical contact with the second surface finish layer of the mounting building block, and the fourth surface finish layer of the spacing building block is in direct physical contact with the cover building block;
  a plurality of conductive vias, electrically connecting the mounting building block, the spacing building block and the cover building block through a connection of the plurality of the conductive vias and at least the second, third and fourth surface finish layers; and
  an encapsulant, filling up a cavity enclosed by the mounting building block, the spacing building block and the cover building block, wherein the at least one electronic component is disposed within the cavity and is embedded within the encapsulant.

2. The semiconductor package structure according to claim 1, wherein the at least one electronic component is electrically bonded to the second bonding pads of the mounting building block through a plurality of bumps.

3. The semiconductor package structure according to claim 2, further comprising an underfill layer disposed around the plurality of the bumps.

4. The semiconductor package structure according to claim 1, wherein the at least one electronic component is electrically bonded to the second bonding pads of the mounting building block through a plurality of wires and the second surface finish layer.

5. A packaging process, comprising:
  providing a mounting building block comprising a core layer having a first surface and a second surface opposite to the first surface, a first conductive layer comprising a plurality of first bonding pads and located on the first surface, and a second conductive layer comprising a plurality of second bonding pads and located on the second surface;
  performing a surface treating process to form a first surface finish layer on at least one of the first bonding pads and a second surface finish layer on at least one of the second bonding pads;
  mounting at least one electronic component on the mounting building block, wherein the at least one electronic component is electrically connected to the mounting building block;
  joining a spacing building block with the mounting building block, so that the at least one electronic component is disposed within a cavity confined by the joined spacing and mounting building blocks;
  filling the cavity with an encapsulant to encapsulate the at least one electronic component; and
  joining a cover building block with the spacing building block to seal the cavity.

6. The process according to claim 5, wherein the at least one electronic component is electrically connected to the mounting building block by flip chip bonding.

7. The process according to claim 5, wherein the at least one electronic component is electrically connected to the mounting building block by wire bonding.

8. The process according to claim 5, wherein joining the spacing building block with the mounting building block comprises directly bonding the spacing building block with the mounting building block by a thermal compression process or an ultrasonic bonding process.

9. The process according to claim 5, wherein joining the spacing building block with the mounting building block comprises applying a conductive adhesive to adhere the spacing building block and the mounting building block.

10. The process according to claim 5, further comprising forming an underfill layer to surround the at least one electronic component before filling the cavity.

11. The process according to claim 5, wherein joining the cover building block with the spacing building block comprises directly bonding the spacing building block with the cover building block by a thermal compression process or an ultrasonic bonding process.

12. The process according to claim 5, wherein joining the cover building block with the spacing building block comprises applying a conductive adhesive to adhere the spacing building block and the cover building block.

13. A semiconductor package structure, comprising:
a mounting building block having at least a first electronic component mounted thereon, wherein the mounting building block comprises:
a first core layer having a first surface and a second surface opposite to the first surface;
a first conductive layer, located on the first surface of the first core layer and comprising a plurality of first bonding pads, wherein a first surface finish layer is disposed on at least one of the first bonding pads; and
a second conductive layer, located on the second surface of the first core layer and comprising a plurality of second bonding pads, wherein a second surface finish layer is disposed on at least one of the second bonding pads, and the at least first electronic component is electrically connected to the second conductive layer of the mounting building block;
a cavity building block, joined with the mounting building block, wherein the cavity building block comprises:
a second core layer having a third surface and a fourth surface opposite to the third surface;
a third conductive layer, located on the third surface of the second core layer and comprising a plurality of third bonding pads, wherein a third surface finish layer is disposed on at least one of the third bonding pads; and
at least a second electronic component mounted to the cavity building block and disposed within a cavity of the cavity building block joined together, wherein the at least second electronic component is electrically connected to the cavity building block, and the third surface finish layer of the cavity building block is in direct physical contact with the second surface finish layer of the mounting building block;
a plurality of conductive vias, electrically connecting the mounting building block and the cavity building block through a connection of the plurality of the conductive vias and at least the second and third surface finish layers; and
an encapsulant, filling up the cavity enclosed by the mounting building block and the cavity building block, wherein the at least first electronic component and the at least second electronic component are located within the cavity and are encapsulated by the encapsulant.

14. The semiconductor package structure according to claim 13, wherein the at least first electronic component is electrically connected to the mounting building block through a plurality of first bumps, while the at least second electronic component is electrically connected to the cavity building block through a plurality of second bumps.

15. The semiconductor package structure according to claim 13, wherein the at least first electronic component is electrically connected to the mounting building block through a plurality of first wires, while the at least second electronic component is electrically connected to the cavity building block through a plurality of second wires.

16. The semiconductor package structure according to claim 13, wherein the cavity building block comprises:
another mounting building block, provided with the second electronic component mounted thereon, wherein the at least second electronic component is electrically connected to the another mounting building block; and
a spacing building block, interlaid between and joined with the two mounting building blocks to form the cavity.

17. A packaging process, comprising:
providing a mounting building block comprising a core layer having a first surface and a second surface opposite to the first surface, a first conductive layer comprising a plurality of first bonding pads and located on the first surface, and a second conductive layer comprising a plurality of second bonding pads and located on the second surface;
performing a surface treating process to form a first surface finish layer on at least one of the first bonding pads and a second surface finish layer on at least one of the second bonding pads;
mounting at least a first electronic component on the mounting building block, wherein the at least first electronic component is electrically connected to the mounting building block;
providing a cavity building block;
mounting at least a second electronic component to the cavity building block, wherein the at least second electronic component is electrically connected to the cavity building block;
filling a cavity of the cavity building block with an encapsulant to encapsulate the at least second electronic component; and
joining the cavity building block with the mounting building block by attaching the cavity building block directly to the second surface finish layer on the second bonding pad, so that the at least first electronic component and the at least second electronic component are embedded with the encapsulant within the cavity confined by the joined cavity and mounting building blocks.

18. The process according to claim 17, wherein joining the cavity building block with the mounting building block comprises directly bonding the cavity building block with the mounting building block by a thermal compression process or an ultrasonic bonding process.

19. The process according to claim 17, wherein joining the cavity building block with the mounting building block comprises applying a conductive adhesive to adhere the cavity building block and the mounting building block.

* * * * *